United States Patent
Chandra

(10) Patent No.: US 7,153,462 B2
(45) Date of Patent: Dec. 26, 2006

(54) INJECTION CASTING SYSTEM FOR ENCAPSULATING SEMICONDUCTOR DEVICES AND METHOD OF USE

(75) Inventor: Haryanto Chandra, Mountain House, CA (US)

(73) Assignee: Vishay Infrared Components, Inc., Santa Clara, CA (US)

( * ) Notice: Subject to any disclaimer, the term of this patent is extended or adjusted under 35 U.S.C. 154(b) by 369 days.

(21) Appl. No.: 10/831,002

(22) Filed: Apr. 23, 2004

(65) Prior Publication Data
US 2005/0238747 A1    Oct. 27, 2005

(51) Int. Cl.
*H01L 21/56* (2006.01)
*B29C 45/14* (2006.01)

(52) U.S. Cl. ............ 264/272.17; 425/121; 425/127; 425/129.1; 425/215; 438/127

(58) Field of Classification Search ......... 425/121, 425/127, 129.1, 215; 438/127; 264/272.17
See application file for complete search history.

(56) References Cited

U.S. PATENT DOCUMENTS

| | | | | |
|---|---|---|---|---|
| 4,268,942 A | * | 5/1981 | Meal et al. ............... 29/25.42 |
| 4,374,080 A | * | 2/1983 | Schroeder ................... 264/102 |
| 4,560,138 A | * | 12/1985 | de Puglia et al. ............. 249/95 |
| 5,407,505 A | * | 4/1995 | Groenewegen et al. ..... 156/153 |
| 5,663,106 A | * | 9/1997 | Karavakis et al. ............ 29/841 |
| 5,665,653 A | * | 9/1997 | Bare et al. ..................... 439/49 |
| 5,817,545 A | * | 10/1998 | Wang et al. ................. 438/127 |
| 5,855,924 A | * | 1/1999 | Lumbard ..................... 425/116 |
| 5,932,254 A | * | 8/1999 | Mitchell et al. ............. 425/117 |
| 5,998,242 A | * | 12/1999 | Kirkpatrick et al. ........ 438/127 |
| 6,329,224 B1 | * | 12/2001 | Nguyen et al. ............. 438/127 |
| 6,503,433 B1 | | 1/2003 | Chandra |
| 6,508,970 B1 | | 1/2003 | Chandra |

FOREIGN PATENT DOCUMENTS

JP    62162337 A    *    7/1987

* cited by examiner

*Primary Examiner*—Robert B. Davis
(74) *Attorney, Agent, or Firm*—McKee, Voorhees & Sease, P.L.C.

(57) ABSTRACT

An injection casting system for encapsulating semiconductor products and method of use includes a mold unit having a cavity, a substrate material placed against the cavity, the cavity being filled by a liquid dispenser in contact with the bottom of the cavity and a running channel at the bottom of the cavity to receive the liquid dispenser for even dispersion of epoxy in the cavity from the bottom of the cavity upward to the top of the cavity.

23 Claims, 3 Drawing Sheets

FIG. 4A  FIG. 4B

INJECTION CASTING SYSTEM FOR ENCAPSULATING SEMICONDUCTOR DEVICES AND METHOD OF USE

BACKGROUND OF THE INVENTION

1. Field of the Invention

The present invention generally concerns encapsulating semiconductor devices and specifically an injection casting system for encapsulating semiconductor devices.

2. Related Information

Encapsulating semiconductors is an important step for protecting a semiconductor surface such as a printed circuit board (PCB) from degrading. In addition, encapsulating permits the forming of lens for use with Infrared Data Transceivers (IrDT) while still protecting the PCB.

The use of IrDT as a device to transmit and receive data wirelessly has been gaining popularity. Devices are equipped with infrared modules such as personal digital assistants (PDA), notebook/laptop computers, digital cameras, mobile phones, and many more.

Traditionally, most semiconductor devices use leadframes as substrate materials, but recently PCBs have been widely used to replace leadframes. Some advantages of using a PCB over leadframes are as follows: 1) better coplanarity, 2) easier to scale down, 3) better electromagnetic interference immunity and improved thermal dissipation, and 4) flexible singulation process (sawing over trim/form). These advantages translate into lower investment for equipment. Therefore, an objective of the present invention is the ability to incorporate PCBs into the injection casting system.

Because of its simplicity, low cost, and fast turn-around time, a cast process is extensively used in the encapsulation process. The cast process is especially economical for low volume production and research and development (R&D) work when compared to a transfer mold. Transfer molding onto PCB substrates with an unfilled epoxy also presents more challenges than transfer molding onto leadframes substrates. Accordingly, a further objective of the present invention is to integrate the advantages of the cast process including simplicity, low cost, and fast turn around time.

The current cast process uses room temperature vulcanizing (RTV) silicone as the mold material. RTV silicone comes in two parts which are then mixed and cured in a master mold to form the epoxy casting RTV silicone molds. The resulting RTV silicone molds are then used to encapsulate the semiconductor substrates. The RTV silicone molds are problematic because they wear out fast and normally last for 10 to 20 cast cycles after which new molds will have to be made again. Also, the RTV silicone mold's properties depend on mix ratio and cure temperature and are therefore susceptible to unintended variations. Furthermore, the use of molds using silicone are problematic because silicone absorbs moisture which can create problematic air bubbles. Silicone is not the best processing agent either because of long preheat and cure time because silicone has poor thermal conductivity. Therefore, a further objective of the present invention is to avoid the problems associated with RTV silicone molds, minimize mold wear, minimize water and air absorption, and provide for shorter preheat and cure times.

In the prior art, once the RTV silicone molds were formed an operator was required to fill each individual cavity with epoxy, each cavity may have lens aperture which would also have to be individually filled. This process is manual and requires a long cycle time. In addition, the yield varies depending on the operator's skill. An automatic solution for this process is difficult to achieve because of the individual manipulation of epoxy for each cavity and lens aperture. Therefore, a still further objective of the present invention is the provision of a fast, simple and easy process that shortens cycle time and improves yield.

Traditionally, after applying the epoxy, the PCB is placed onto the mold. This process results in a high probability of air entrapment that can not be removed. This step is especially problematic because neither a vacuum chamber nor a pressurized chamber may be used to prevent air entrapment. Accordingly, a still further objective of the present invention is the use of a vacuum or pressurized chamber to eliminate air bubbles.

In addition, several other problems are identifiable with RTV silicone molds. For example, the substrate or PCB size is limited due to a large thermal expansion mismatch between silicone RTV and PCB substrates and the narrow processing (i.e. curing) temperature for RTV silicone molds. Therefore, a still further objective of the present invention is to minimize the expansion mismatch and the narrow processing temperature associated with RTV silicone molds.

A still further objective of the present invention is the provision of a injection casting system for encapsulating semiconductor devices and method of use that is economical to manufacture, durable in use, and efficient in operation.

BRIEF SUMMARY OF THE INVENTION

An injection casting system for encapsulating semiconductor devices and method of use has been developed to improve yield, to reduce encapsulation time, and to allow encapsulating deep lens cavity for optoelectronic devices. This invention utilizes a combination of a controllable liquid dispensing system and a runner system to achieve a balanced flow of material in a cast process. To prevent air entrapment, the cast mold has a vertical cavity with an opening on the top. Instead of pouring or dispensing material from the top (as in the standard cast process), encapsulating material is injected into a desired location (e.g. bottom of cavity), which is then distributed by the runner system throughout the mold cavity. This way, the mold cavity is filled from the bottom up, and as the material flows up, it pushes air upward. The vertical mold position also allows the air to easily rise to the surface, thereby minimizing defect due to air entrapment. The process is economical, reduces cycle time, provides better process control, reduces defects, permits larger allowed substrate size, and produces a yield that is less operator-dependent.

The injection casting system for encapsulating semiconductor devices and method of use has several features absent from the prior techniques of using leadframes, transfer molding, and RTV silicone molds. These features are summarized as follows:

Fast, simple and easy process.
Flow can be easily controlled.
Minimum air entrapment.
Vacuum or pressurized chamber can be utilized to eliminate air bubbles if necessary.
Very little expansion mismatch between stainless steel and PCB, allowing better tolerance over larger PCB.
Fast preheat and cure due to higher thermal conductivity of stainless steel.
No moisture sensitivity issue.
Mold wear is negligible.

These, as well as other features and advantages of the present invention will become apparent from the following specification and claims.

BRIEF DESCRIPTION OF THE DRAWINGS

FIGS. 4A–C are cross-sectional views taken along line 4—4 of FIG. 2 showing the filling of the mold unit with epoxy.

DETAILED DESCRIPTION OF THE PREFERRED EMBODIMENT

Figure 1:
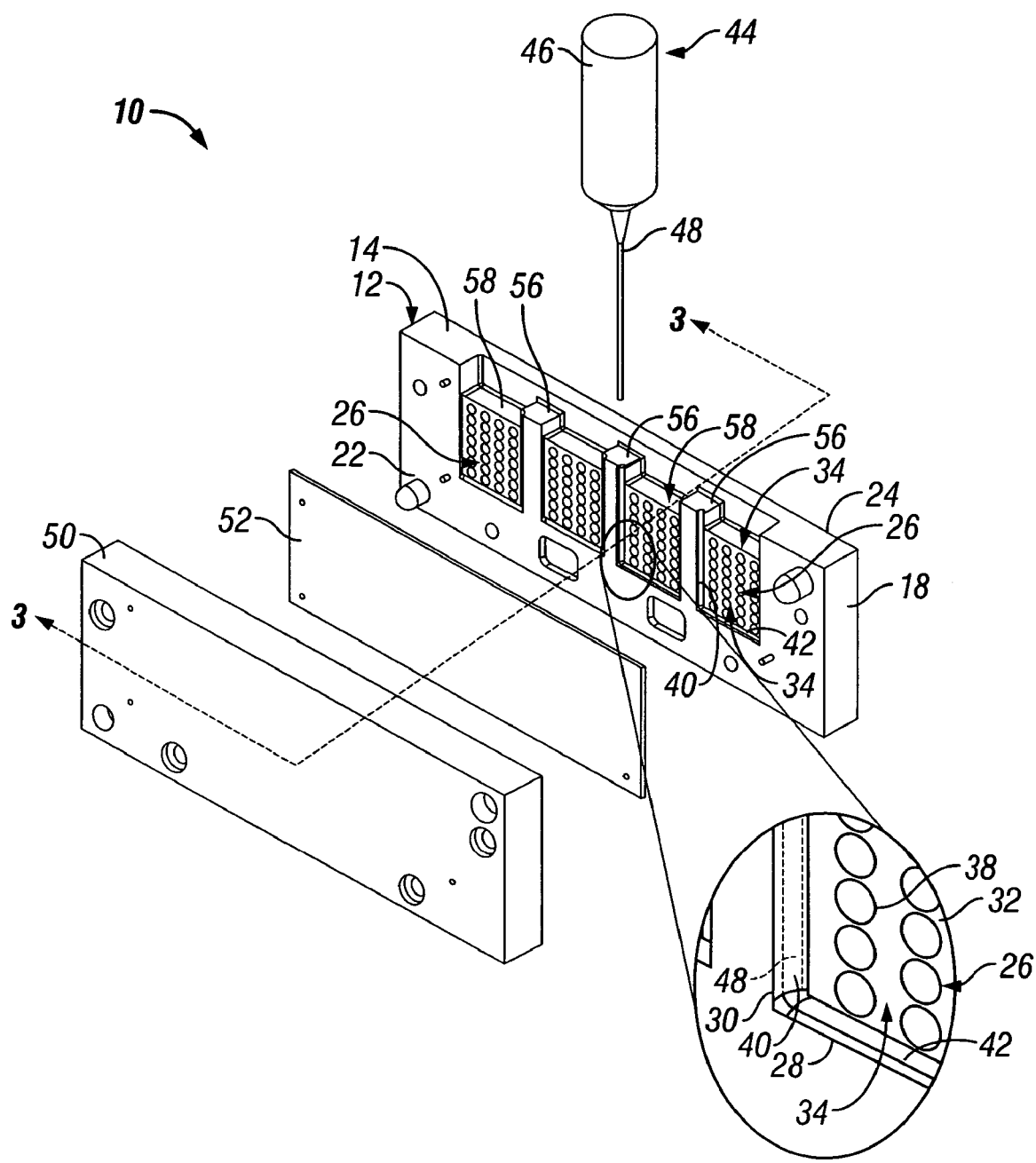
FIG. 1 is a perspective view of the injection casting system in an exploded perspective view.

Referring to FIG. 1 an injection casting system is generally designated by the numeral 10. The injection casting system 10 includes a mold unit 12 which comprises top side 14, bottom side 16, longitudinal sides 18, an inner face 22, and an outer face 24. The mold unit is typically stainless steel.

A cavity 26 extends into the inner face 22. The cavity 26 is defined by inset bottom side 28, inset longitudinal sides 30, and an inset back face 32. As most clearly seen in FIG. 3, the cavity 26 has an open face 34 and an open top side 36. The inset back face 32 may have aperture 38 further inset into the cavity 26.

As seen in FIG. 1, the cavity has a dispensing channel 40 extending from the top side 14 into the cavity 26. The dispensing channel 40 may parallel the longitudinal sides 30. In addition, the cavity 26 has a running channel 42 adjacent to the dispensing channel 40. The running channel 42 may parallel the bottom side 28. The running channel 42 may be used without a dispensing channel 40.

A liquid dispenser 44 is provided having a reservoir 46 and a needle 48. The liquid dispenser 44 is positioned over the dispensing channel 40 and inserted such that the needle 48 comes in contact with the running channel 42. The reservoir 46 stores the encapsulation material or epoxy 54 and the dispensing needle 48 provides a throughway for dispensing the epoxy 54 in a controlled manner to the running channel 42.

A plate 50 is provided for securing to the inner face 22 of the mold unit 12 over the open face 34 of the cavity 26. The plate 50 is typically stainless steel.

Positioned intermediate the mold unit 12 and the plate 50 is the substrate material 52. As shown in FIG. 1, the substrate material 52 is a printed circuit board. The substrate material may be other devices.

Figure 2:
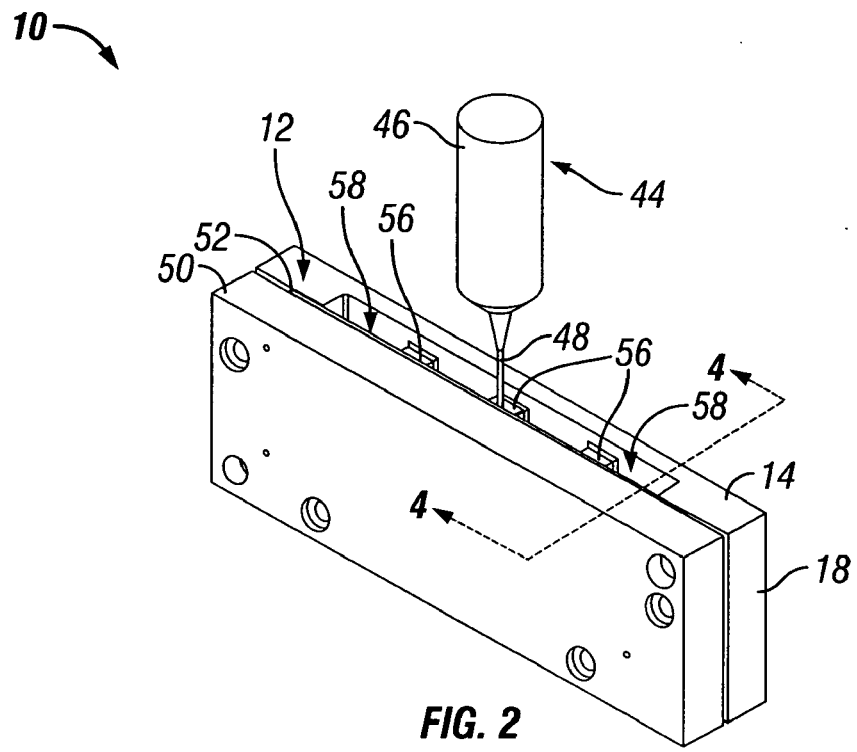
FIG. 2 is a perspective view of the injection casting system with the plate, printed circuit board, and mold unit fastened together.

As seen in FIG. 1, holes in the printed circuit board mate with pegs on the mold unit 12. The plate 50 mates with knobs on the mold unit 12 to clamp the printed circuit board 52 firmly in position. FIG. 2 shows the plate 50 securely clamping the printed circuit board 52 to the mold unit 12.

As further seen in FIG. 1, the mold unit 12 has four cavity 26 segments.

Furthermore, each cavity 26 may have an arrangement of repeating apertures. In other words, each cavity 26 consists of many potential devices. The apertures may be arranged in a longitudinal series, a lateral series, or a combination longitudinal and lateral series.

The size of each cavity 26 is designed to maximize the number of parts while minimizing defects from warpage.

When using a clear epoxy 54, defects from warpage are especially troublesome because clear molding epoxy typically has an expansion coefficient of around $60 \times 10^{-6}/°$ C. This warpage is minimized by pressing the PCB firmly between the plate 50 and mold unit 12. The seal may also be assisted by tenting material (not shown) a kind of dry film solder mask on PCB substrate to create a better seal. The tenting material is typically around 0.002 inches thick.

Figure 3:
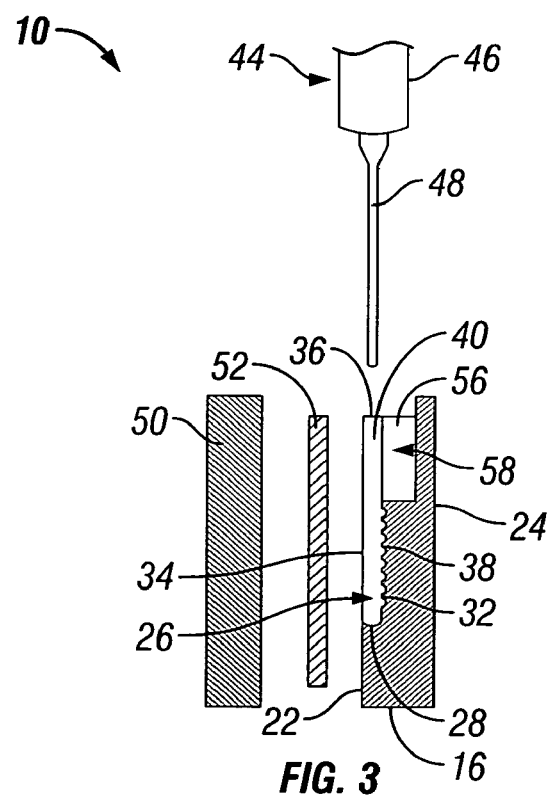
FIG. 3 is a cross-sectional view taken along line 3—3 of FIG. 1.

As seen in FIG. 3, the method of using the injection casting system begins with the liquid dispenser 44 in alignment with the dispensing channel 40.

Before closing the plate 50 and PCB 52 upon the mold unit, a thin mold release agent is applied uniformly across the mold surface and specifically upon the cavity 26 and aperture 38 areas. The PCB 52 and plate 50 are then aligned and placed upon the mold unit 12. Once the mold unit 12, PCB 52, and plate 50 are aligned, they may be placed together 30 securely by screws, a press vice, or other system. Typically, the molds are preheated depending on the viscosity of the encapsulation material or epoxy 54. However, preheating the mold unit 12 may not be necessary if the viscosity of the encapsulation material 54 is thin enough to flow readily into the cavity 26.

Figure 4C:
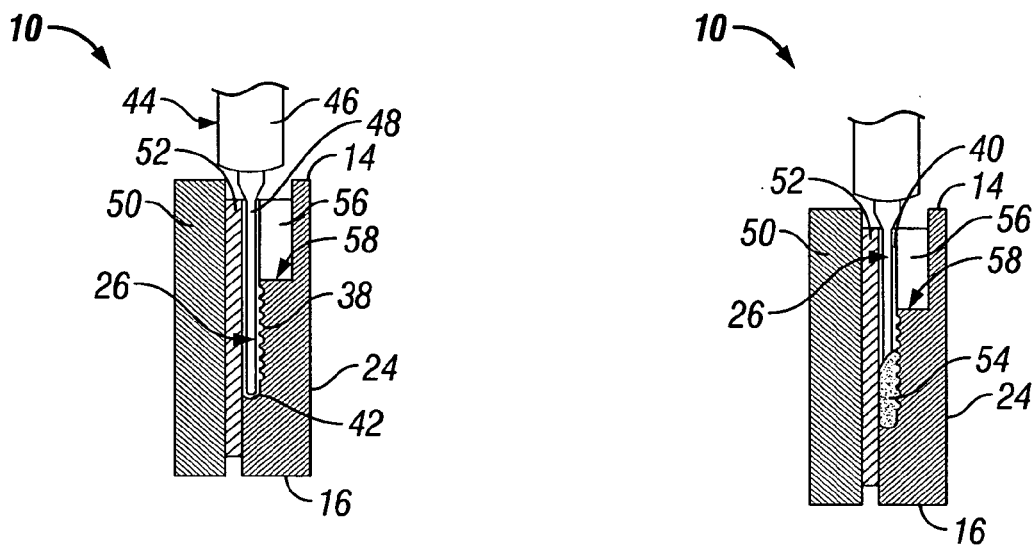
Figure 4C:
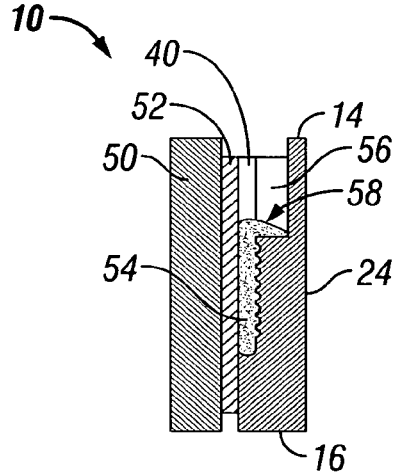

As seen in FIG. 4A, the dispensing needle 48 is inserted into the dispensing channel 40. The dispensing needle 48 is typically positioned at the bottom of the dispensing channel 40 so that it contacts the running channel 42.

As seen in FIG. 4B, the epoxy 54 is then distributed from the reservoir 46 through the needle 48 to begin filling the running channel 42 and the cavity 26. As epoxy 54 fills the cavity 26 it flows upward against gravity and presses air upward from the cavity 26. The epoxy 54 is applied gradually so that few if any air bubbles and moisture are left within the cavity 26 and the apertures 38. Once the encapsulation material 54 fills the cavity it will enter into an overflow area 58. A divider 56 prevents any encapsulation material 54 from traveling into a neighboring cavity 26.

The user may then remove excess material if present in the overflow area 58. The encapsulating material 54 can then be cured a short time in the mold and then removed for a longer cure.

Figure 5:
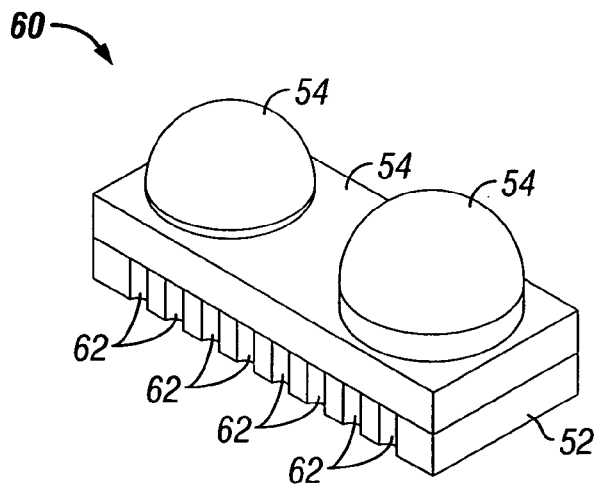
FIG. 5 is a perspective view of the finished product from the injection casting system, specifically an IR data transceiver.

Final preparation of the encapsulated material takes the encapsulated PCB and saws or dices it up into individual devices. An illustration of this is the infrared data transceiver as shown in FIG. 5. After sawing the finished product 60, it is completed by inserting solder pads 62. Although an infrared data transceiver is shown in FIG. 5, the method can be applied to many other applications including a simple flat-surface cavity and a cavity with deep-lens apertures.

The invention has been shown and described above with the preferred embodiments, and it is understood that many modifications, substitutions, and additions may be made which are within the intended spirit and scope of the invention. From the foregoing, it can be seen that the present invention accomplishes at least all of its stated objectives.

What is claimed is:

1. An injection casting system for encapsulating semiconductor products, the injection casting system comprising:

a mold unit having top and bottom opposite sides, first and second opposite longitudinal sides, inner and outer opposite faces, a cavity extending into the inner face and a running channel within the cavity;

a plate for securing to the inner face of the mold unit;

a liquid dispenser for dispensing encapsulation material into the cavity, wherein the liquid dispenser includes a reservoir in which is stored the encapsulation material, a dispensing needle for dispensing the encapsulation material into the running channel.

2. The injection casting system of claim 1 wherein the mold unit has an overflow chamber extending from the top side to the cavity.

3. The injection casting system of claim 1 further comprising a dispensing channel extending from the top side into the cavity.

4. The injection casting system of claim 1 wherein the cavity has at least one lens aperture.

5. The injection casting system of claim 4 wherein the lens apertures are arranged in a longitudinal series from a bottom of the cavity to a top of the cavity.

6. The injection casting system of claim 5 wherein the lens apertures are arranged in a lateral series.

7. The injection casting system of claim 5 wherein the running member is positioned to first begin filling the lens aperture at the bottom of the cavity.

8. The injection casting system of claim 1 wherein the mold unit longitudinal sides are vertical.

9. The injection casting system of claim 2 wherein the mold unit lateral sides are horizontal.

10. The injection casting system for encapsulating semiconductor products, the injection casting system comprising:
    a mold unit having a cavity with an open face, an open top, a longitudinal dispensing channel, and a lateral running channel;
    a plate for securing over the open face of the cavity;
    a liquid dispenser for dispensing an encapsulation material in an uncured state into the cavity, wherein the liquid dispenser includes a reservoir in which is stored the encapsulation material, a dispensing needle for dispensing the encapsulation material.

11. The injection casting system of claim 10 wherein the mold unit has an overflow chamber.

12. The injection casting system of claim 10 wherein the longitudinal dispensing channel extends to a bottom of the cavity.

13. The injection casting system of claim 12 wherein the lateral running channel is adjacent to the longitudinal dispensing channel.

14. The injection casting system of claim 10 further comprising a printed circuit board intermediate the mold unit and the plate.

15. The injection casting system of claim 10 wherein the longitudinal running channel is vertical.

16. A method for encapsulating semiconductor products, the method comprising:
    providing a mold unit having a cavity with an open face, an open top, a dispensing channel, and a running channel;
    placing a substrate material adjacent the open face of the cavity;
    dispensing encapsulating material into the cavity, by using a dispensing needle placed in connection with the dispensing channel; and
    filling the lens cavity by moving encapsulation material along the running channel and upward through the cavity.

17. The method of claim 16 further comprising the step clamping a plate to secure the substrate material to the mold unit.

18. The method of claim 17 wherein the substrate material is a printed circuit board.

19. The method of claim 16 wherein the dispensing step further comprises transferring the encapsulation material from a reservoir.

20. The method of claim 16 further comprising heating the mold.

21. The method of claim 16 further comprising curing the encapsulating material.

22. The method of claim 16 further comprising applying a mold release agent to the cavity.

23. The method of claim 16 wherein the cavity further comprises lens apertures.

* * * * *